(12) United States Patent  
Wu

(10) Patent No.: US 7,033,956 B1  
(45) Date of Patent: Apr. 25, 2006

(54) SEMICONDUCTOR MEMORY DEVICES AND METHODS FOR MAKING THE SAME

(75) Inventor: Yung-Hsien Wu, Taipei (TW)

(73) Assignee: ProMOS Technologies, Inc., Hsinchu (TW)

( * ) Notice: Subject to any disclaimer, the term of this patent is extended or adjusted under 35 U.S.C. 154(b) by 0 days.

(21) Appl. No.: 10/976,798

(22) Filed: Nov. 1, 2004

(51) Int. Cl.
*H01L 21/31* (2006.01)
*H01L 21/469* (2006.01)

(52) U.S. Cl. .................... 438/765; 438/769; 438/762

(58) Field of Classification Search ........... 438/765, 438/762, 767, 769, 779, 775, 776
See application file for complete search history.

(56) References Cited

U.S. PATENT DOCUMENTS

| | | | | |
|---|---|---|---|---|
| 5,241,214 | A * | 8/1993 | Herbots et al. | 257/649 |
| 5,783,498 | A * | 7/1998 | Dotta | 438/778 |
| 6,656,792 | B1 * | 12/2003 | Choi et al. | 438/257 |
| 6,746,943 | B1 * | 6/2004 | Takayanagi et al. | 438/587 |
| 2005/0098822 | A1 * | 5/2005 | Mathew et al. | 257/314 |
| 2005/0142769 | A1 * | 6/2005 | Kamata et al. | 438/287 |

OTHER PUBLICATIONS

Tiwari, et al., "Volatile and Non-Volatile Memories in Silicon with Nano-Crystal Storage", IEEE 1995, IEDM 95-521, pp. 20.4.1-20.4.4, Yorktown Heights, NY.

Hanafi, et al., "Fast and Long Retention-Time Nano-Crystal Memory", IEEE Transactions on Electron Devices, vol. 43, No. 9, Sep. 1996, pp. 1553-1558, Yorktown Heights, NY.

Zacharias, et al., "A Comparative Study of Ge Nanocrystals in Six, GeyOz alloys and SiOx/GeOy Multilayers", J. Appl. Phys. 81 (5), Mar. 1997, American Institute of Physics, 1997, pp. 2384-2390, Poughkeepsie, NY.

Steimle, et al., "Hybrid Silicon Nanocrystal Silicon Nitride Dynamic Random Access Memory", IEEE Transactions on Nanotechnology, vol. 2, No. 4, Dec. 2003, pp. 335-340, Austin, TX.

Takata, et al., "New Non-Volatile Memory with Extremely High Density Metal Nano-Dots", IEEE 2003, IEDM 03-553, pp. 22.5.1-22.5.2, Japan.

King, et al., "Charge-Trap Memory Device Fabricated by Oxidation of Si1-xGeX", IEEE Transactions on Electron Devices, vol. 48, No. 4, pp. 696-700, Berkeley, CA.

* cited by examiner

*Primary Examiner*—Caridad Everhart
(74) *Attorney, Agent, or Firm*—Akin Gump; Strauss Hauer & Feld, LLP

(57) ABSTRACT

Methods for making memory devices are disclosed for forming germanium nanocrystals in an oxynitride layer. The method includes: forming a first dielectric layer over a substrate; forming an oxynitride layer containing germanium nanocrystals over the first dielectric layer; forming a second dielectric layer over the oxynitride layer; forming a gate over the second dielectric layer; and providing source, drain, and channel regions in the substrate. In one example, the channel region is positioned to correspond to at least a portion of the gate.

24 Claims, 4 Drawing Sheets

SEMICONDUCTOR MEMORY DEVICES AND METHODS FOR MAKING THE SAME

FIELD

The present invention relates generally to semiconductor memory devices and methods for making the same. Specifically, the present invention relates to memory devices containing semiconductor nanocrystals and methods of making such memory devices.

BACKGROUND

Memory devices are widely used in various electronics and computing devices. For example, computing devices and consumer-electronics store data, e.g., texts, e-mails, images, music, and videos, in one or more memory devices. The need for additional memory capacity is increasing with the expanded capabilities of today's consumer electronics and portable devices. To accommodate the need, memory devices need to provide reliability, low-power-consumption, light weight portability, small size, or a combination of these characteristics.

Non-volatile memories, such as flash memories, also known as flash electrically-erasable-programmable read-only-memories (flash EEPROMs), are among the most popular memory devices. These memory devices offer reprogramablility without requiring continuous power consumption to maintain the stored data. In the past decade, the need for non-volatile memories, including low-power or high-density memory devices, in consumer electronics and portable devices has increased dramatically. Consequently, memory design and manufacturing need to improve to satisfy such demands.

SUMMARY

An example of the present invention provides a method of forming a memory device. The method includes: forming a first oxide layer over a substrate; performing a nitridation of at least an upper portion of the first oxide layer; forming a semiconductor layer comprising germanium over the first oxide layer; oxidizing the semiconductor layer to provide a germanium oxide layer over the first oxide layer and a second oxide layer over the germanium oxide layer; and forming, from the germanium oxide layer, an oxynitride layer containing germanium nanocrystals.

Another example of the present invention provides a method of forming a memory device. The method includes: forming a first oxide layer over a substrate; forming a semiconductor layer comprising germanium over the first oxide layer; and forming, from the semiconductor layer, an oxynitride layer containing germanium nanocrystals over the first oxide layer and a second oxide layer over the oxynitride layer. In one embodiment, the first oxide layer has a higher nitrogen element concentration at an upper portion of the first oxide layer.

Another example of the present invention provides a method of forming a memory device. The method includes: forming a first dielectric layer over a substrate; forming an oxynitride layer containing germanium nanocrystals over the first dielectric layer; forming a second dielectric layer over the oxynitride layer; forming a gate over the second dielectric layer; and providing source, drain, and channel regions in the substrate. In one example, the channel region is positioned to correspond to at least a portion of the gate.

An example of the present invention provides a semiconductor device. The semiconductor device includes a substrate and a memory device formed on the substrate. In particular, the memory device includes an oxynitiride layer having germanium nanocrystals embedded in the oxynitride layer.

Another example of the present invention provides a semiconductor device. The device includes: a first dielectric layer over a substrate; an oxynitride layer containing germanium nanocrystals over the first dielectric layer; a second dielectric layer over the oxynitride layer; a gate structure over the second dielectric layer; and a source region, a drain region, and a channel region in the substrate. In one example, the channel region is positioned to correspond to at least a portion of the gate.

Another example of the present invention provides a semiconductor device. The device includes: a first dielectric layer over a substrate; an oxynitride layer containing germanium nanocrystals over the first dielectric layer; and a second dielectric layer over the oxynitride layer. In one example, the formation of the germanium nanocrystals includes: forming a semiconductor layer comprising germanium over the first dielectric layer; oxidizing the semiconductor layer to form a germanium oxide layer over the first dielectric layer and a second dielectric layer over the germanium oxide layer; and annealing the germanium oxide layer to form the oxynitride layer.

DETAILED DESCRIPTION OF THE INVENTION

The following examples illustrate improvements to memory devices and memory fabrication methods. According to one example, an improved non-volatile memory device includes semiconductor nanocrystals, such as germanium nanocrystals. In one example, a silicon oxynitride layer may be formed to provide germanium nanocrystals in the oxynitride layer. Other examples may have the silicon oxynitride formed by the oxidation of a germanium-containing layer. Another example of a memory device on a semiconductor substrate may include an oxynitiride layer having germanium nanocrystals embedded in the oxynitride layer. As discussed below, these examples of memory devices are exemplary only and other variations may exist.

Figure 1:
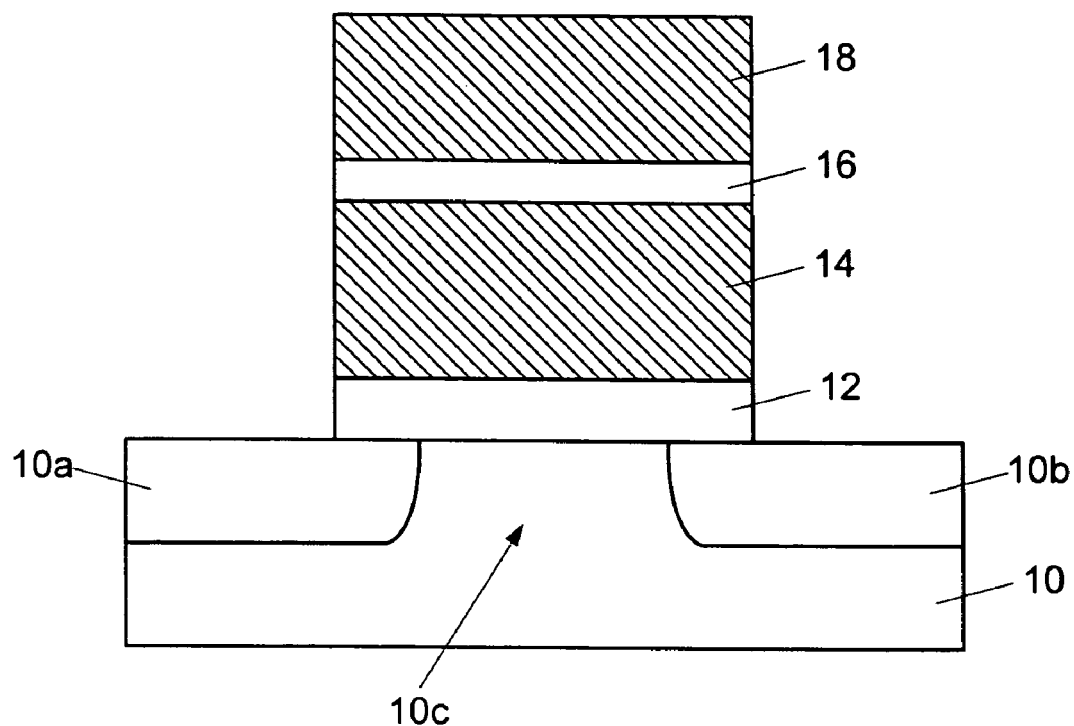
FIG. 1 is a schematic diagram illustrating an exemplary stacked-gate memory design.

In the field of memory devices, non-volatile memory devices may employ different structural designs and materials. For example, a stacked-gate design is one of the prevailing non-volatile memory implementations for standalone memories, embedded memories, or both. This design can be used for code storage, data storage, or both. FIG. 1 shows a schematic diagram illustrating an exemplary stacked-gate memory design.

Referring to FIG. 1, a memory device formed on semiconductor substrate 10 may include dielectric layer 12 over substrate 10, a stacked a gate structure having layers 14, 16, and 18 over dielectric layer 12, and source region 10a, drain region 10b, and channel region 10c in substrate 10. Channel region 10c may be positioned to correspond to at least a portion of the gate structure. In this example, the gate structure may include floating gate 14, control gate 18, and dielectric layer 16 between floating gate 14 and control gate 18.

Examples of dielectric layer 12 include a tunnel oxide. This layer may be designed to have a sufficient thickness for preventing floating-gate charge-loss to the region under floating gate 14 under normal read operations or during data or charge retention. However, a thick dielectric layer 12 may require the injection of a charge into floating gate 14 at a high voltage. In some cases, the high-voltage charge-injection may result in hot-carrier degradation, where electron-hole pairs generated by energetic carriers are injected into dielectric layer 12, causing undesired damages or traps and device degradation.

To avoid such problems, a memory device may employ a different material as a storage medium. For example, a silicon nitride layer or semiconductor nanocrystals may be used to replace floating gate 14. In some examples, the use of nanocrystals allows for thinner layers, which may enable low voltage operations for a memory device. When using nanocrystals, a memory device may employ different types of nanocrystals in combination with different designs of dielectric layer 12. For example, a memory device may employ silicon (Si) nanocrystals to replace floating gate 14 of FIG. 1. Alternatively, germanium (Ge) nanocrystals may be used, and the smaller band gap of germanium nanocrystals may provide a smaller barrier for the programming and erasing operations of a memory device.

Figure 2:
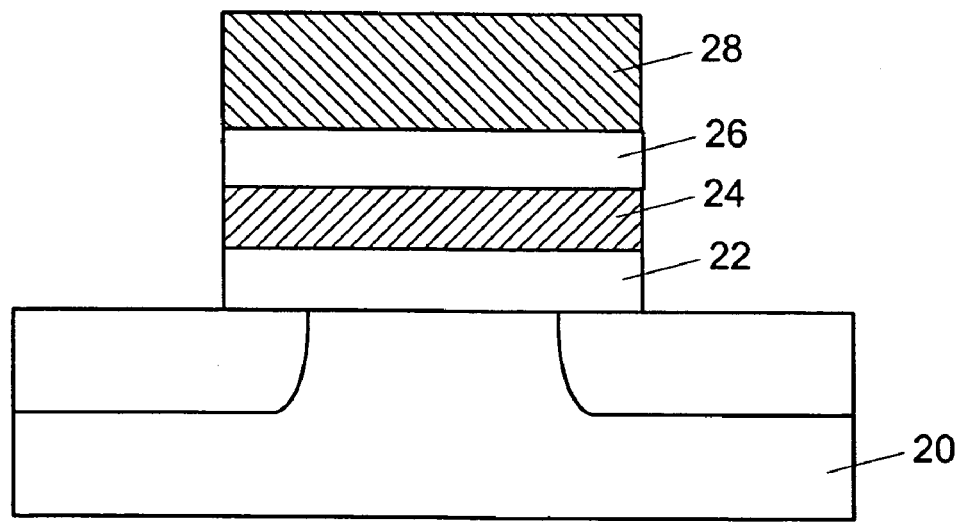
FIG. 2 is a schematic diagram of a memory device using silicon nitride as a storage medium according to our example.

FIG. 2 is a schematic diagram of a memory device using silicon nitride as a storage medium according to one example. Referring to FIG. 2, the memory device on substrate 20 may include a stacked structure of silicon oxide layer 22, silicon nitride layer 24, silicon oxide layer 26, and gate 28 of polysilicon, thereby providing an example of an SONOS (silicon-oxide-nitride-oxide-silicon) structure. Substrate 20 may include source, drain, and channel regions similar to substrate 10 in FIG. 1 for performing memory operations. Other examples may have silicon nitride serve as a charge-trapping medium, which may replace floating gate 14 of FIG. 1 and provide a similar operation of a non-volatile memory device.

Figure 3:
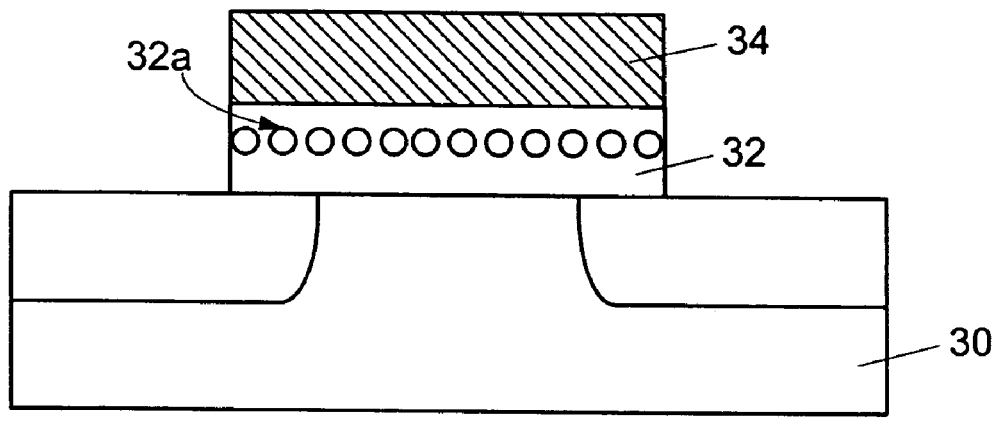
FIG. 3 is a schematic diagram of a memory device using silicon nanocrystals as a storage medium according to our example.

FIG. 3 is a schematic diagram of a memory device using silicon nanocrystals as a storage medium according to another example. Referring to FIG. 3, the memory device on substrate 30 may include silicon oxide layer 32 containing silicon nanocrystals 32a and gate 34 of polysilicon. Substrate 30 similarly contains source, drain, and channel regions to enable memory operations. In this example, the memory device may store or trap charges in silicon nanocrystals 32a, which may provide intermediate states for facilitating tunneling transportation of charges. This can allow, in some cases, faster programming and erasing operations of the memory device than the SONOS device shown in FIG. 2.

Figure 4:
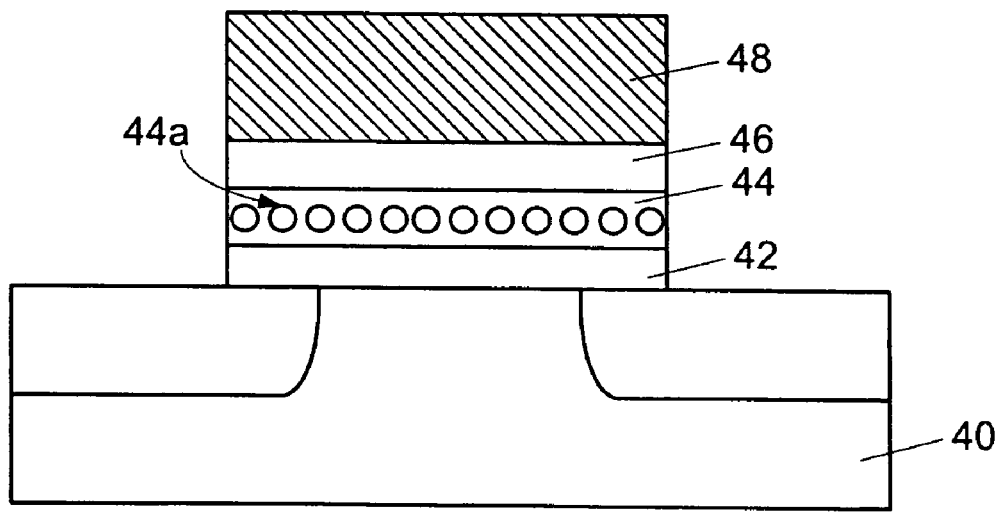
FIG. 4 is a schematic diagram of a memory device using both silicon nitride and silicon nanocrystals as a storage medium according to our example.

FIG. 4 is a schematic diagram of a memory device using both silicon nitride and silicon nanocrystals as a storage medium according to another example. Referring to FIG. 4, the memory device on substrate 40 may include a stacked structure of silicon oxide layer 42, silicon nitride layer 44, silicon oxide layer 46, and gate 48 of polysilicon. Silicon nanocrystals 44a may be provided in at least a portion of silicon nitride layer 44. Substrate 40 similarly contains source, drain, and channel regions for enabling memory operations. In this example, the memory device may store or trap charges in silicon nitride layer 44, silicon nanocrystals 44a, or both.

In another example, the above-illustrated structure may be formed by direct deposition of silicon nanocrystals on a silicon oxide layer over a substrate, followed by nitride deposition, such as nitride deposition via a low-pressure chemical-vapor-deposition (LPCVD) process. In other examples, process parameters such as temperature and pressure may be rigorously controlled to produce desirable silicon nanocrystals. Alternatively, silicon nanocrystals may be provided by excess silicon implantation into a dielectric layer, such as a silicon oxide layer, followed by high temperature anneal. However, depending on the specific implementations and equipment employed, some of those processes may have restraints on the thickness of the silicon oxide layer and may affect the integrity or characteristics of the silicon oxide material.

Figure 5:
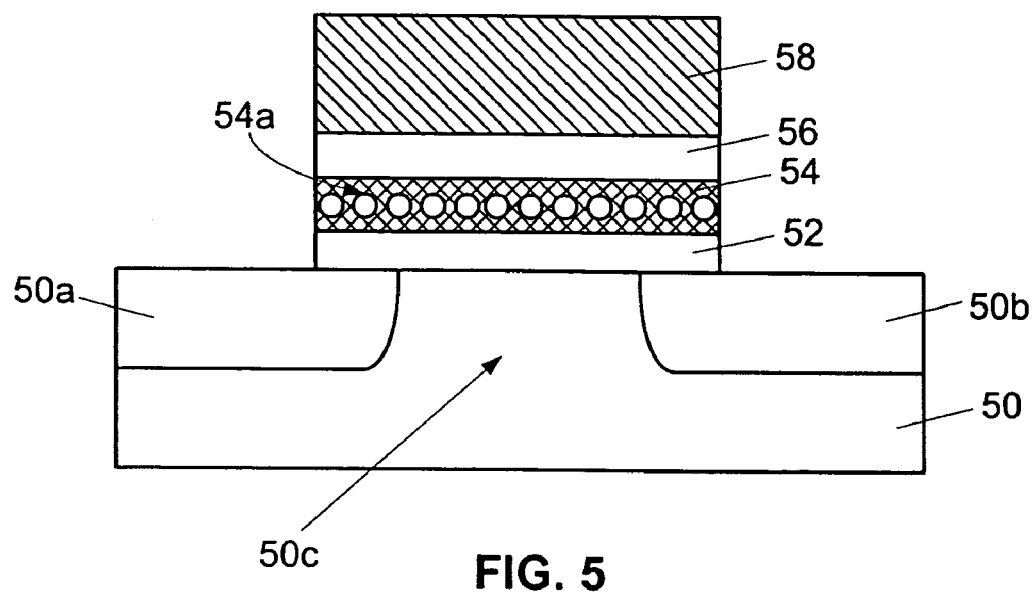
FIG. 5 is a schematic diagram of a memory device having germanium nanocrystals in a dielectric layer according to our example.

Other examples may use germanium-nanocrystal memory devices described above. FIG. 5 is a schematic diagram of a memory device having germanium nanocrystals in a dielectric layer according to one example.

Referring to FIG. 5, a memory device on substrate 50 may include first dielectric layer 52, oxynitride layer 54 containing germanium nanocrystals 54a, second dielectric layer 56, and gate 58. In one example, first dielectric layer 52 is provided over substrate 50; oxynitride layer 54 is provided over first dielectric layer 52; second dielectric layer 56 is provided over oxynitride layer 54; and gate 58 is provided over second dielectric layer 56. As shown in FIG. 5, substrate 50 has source region 50a, drain region 50b, and channel 50c therein, and channel region 50c may be positioned to correspond to at least a portion of gate 58.

In another example, oxynitride layer 54 may include germanium nanocrystals 54a therein, which may be provided using different approaches. For example, the approach of providing silicon nanocrystals noted above, either by spreading or implanting the silicon elements or nanocrystals, may be used. Alternatively, in some examples, germanium nanocrystals may be provided through an oxidation process, as described below.

Figure 6:
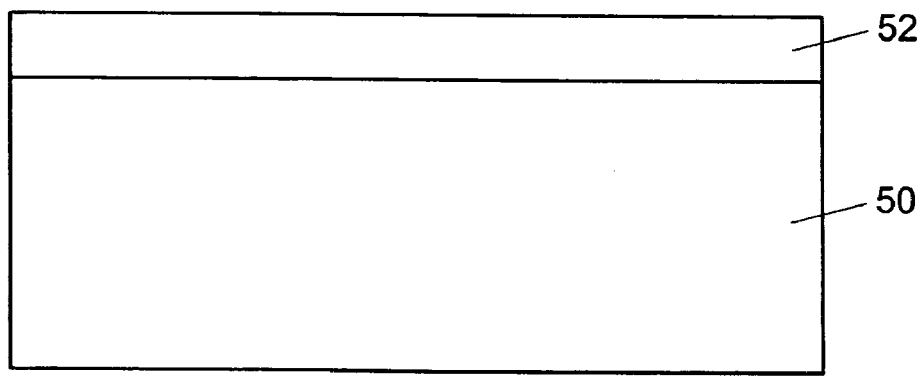
FIG. 6 is a schematic diagram illustrating the formation of a dielectric layer over a substrate according to our example.

Referring to FIG. 6, to form a memory device, semiconductor substrate 50, such as a silicon substrate, may be provided. Dielectric layer 52, such as a silicon oxide layer, is then formed over substrate 50. In one example, dielectric layer 52 may be formed by oxidizing a portion of substrate 50 or by oxidizing an exposed surface, such of the top surface, of substrate 50 to grow silicon oxide from substrate 50. For example, a wet oxidation process can form a first dielectric layer 52 of silicon oxide from substrate 50, and at least a portion of the silicon oxide formed from substrate 50 may serve as a tunnel oxide of the memory device.

In one example, dielectric layer 52 of silicon oxide may be configured to have a higher nitrogen element concentration at an upper portion of dielectric layer 52. One way of providing the nitrogen concentration distribution is to perform a nitridation of the upper portion of dielectric layer 52. For example, a nitridation process may apply nitrogen plasma to dielectric layer 52. Through nitridation, dielectric layer 52 may be converted to provide a tunnel oxide layer over substrate 50 and a nitrogen-containing barrier layer over the tunnel oxide layer. In one example, a silicon oxide may provide better dielectric characteristics, such as a higher dielectric constant, or a higher K value, after nitridation. Furthermore, it is noted that the barrier layer, such as a dielectric or silicon oxide material containing a higher nitrogen concentration than the underlying oxide layer, may also be formed by other approaches known to skilled artisans.

Figure 7:
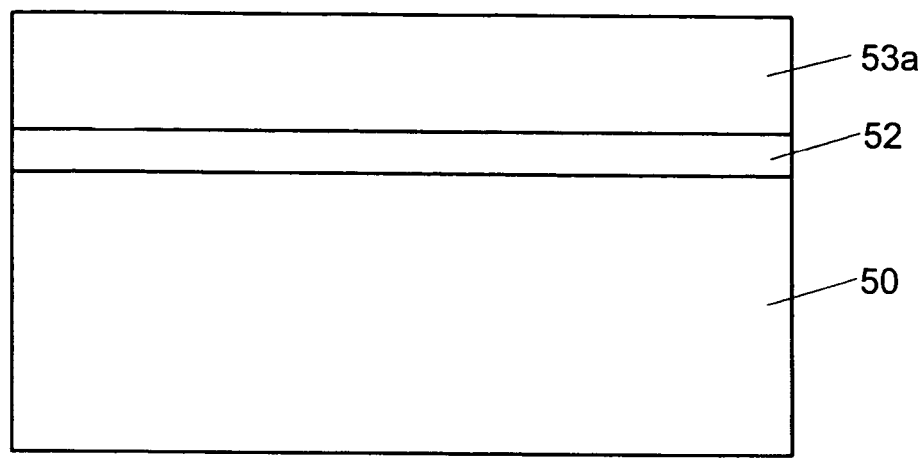
FIG. 7 is a schematic diagram illustrating the formation of a semiconductor layer over a dielectric layer according to our example

After providing dielectric layer 52 over substrate 52, oxynitride layer 54 and dielectric layer 56 may be formed over dielectric layer 52. The oxynitride layer 54 and dielectric layer 56 may be formed through oxidizing a semiconductor layer. For example, referring to FIG. 7, semiconductor layer 53a containing germanium may be formed over dielectric layer 52. The silicon-germanium layer, such as a poly-silicon-germanium layer, may be provided by deposition.

Figure 8:
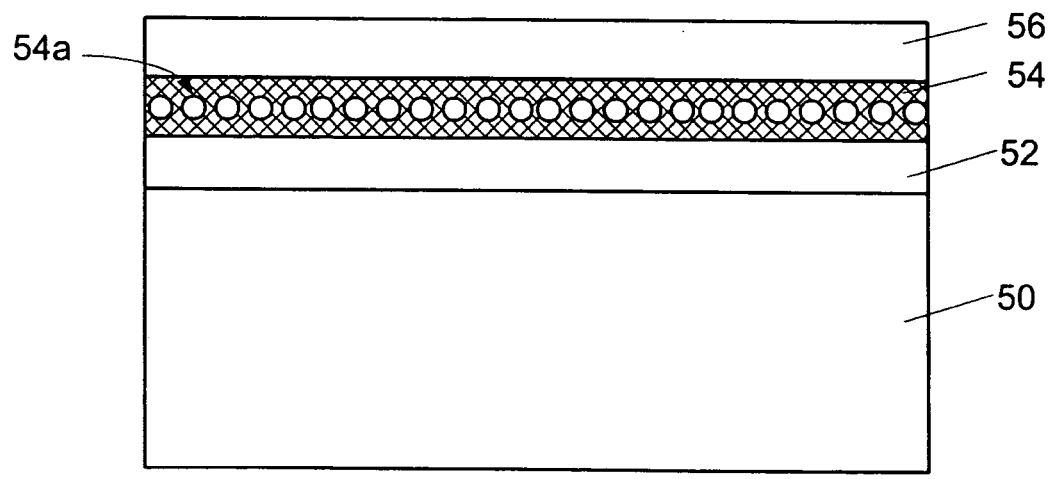
FIG. 8 is a schematic diagram illustrating the formation of a dielectric layer containing germanium nanocrystals and another dielectric layer over the germanium-containing dielectric layer according to our example.

Referring to FIG. 8, semiconductor layer 53a may then be oxidized to provide a germanium oxide layer over dielectric layer 52 and dielectric layer 56 of silicon oxide over germanium oxide layer. Following the oxidation, germanium oxide layer may be annealed to provide oxynitride layer 54 containing germanium nanocrystals 54a. The annealing process may be a one-step or a two-step process. For example, germanium oxide layer may be annealed first to provide germanium nanocrystals 54a in a mostly silicon oxide material, and the germanium-nanocrystal-containing area may be further annealed in a nitrogen-containing environment to provide oxynitride layer 54.

In an exemplary embodiment, the first anneal may include a thermal anneal in an argon or nitrogen environment at a temperature above 650° C., such as about 700° C. –800° C., and the second anneal may include a thermal anneal in an NH$_3$-containing environment at a temperature above 700° C., such as about 750° C.–900° C. In one embodiment, the second anneal may nitridize the silicon oxide material surrounding germanium nanocrystals 54a to provide oxynitride layer 54.

In one example, the second anneal in the NH$_3$-containing environment nitridizes the oxide surrounding the germanium nanocrystals, converting some or all of them into oxynitride. Nitridation may also introduce electron traps in oxynitride layer 54, which may enhance the operational characteristics of the memory device. Furthermore, during the second anneal, the higher nitrogen element concentration at the upper portion of dielectric or oxide layer 52 may provide a good barrier layer, which may prevent diffusion of NH$_3$ molecules through tunnel oxide and preserve oxide integrity during the nitridation to form oxynitride layer 54. In addition, nitrogen may be mainly distributed at or near the upper portion of dielectric layer 52, thereby effectively nitridizing the oxide surrounding germanium nanocrystals 54a into oxynitride.

Referring to FIG. 5, after providing oxynitride layer 54 and dielectric layer 56, gate 58 may be formed over dielectric layer 56. In one example, gate 58 may be a polysilicon layer formed and patterned to provide a desired gate structure. In addition, the underlying layers, including dielectric layer 52, oxynitride layer 54, and dielectric layer 56, may also be patterned to form the island-like structure illustrated in FIG. 5. Alternatively, another conductive material or a combination of two or more conductive materials may be used for providing gate 58.

Substrate 50 may be doped to provide source region 50a, drain region 50b, and channel 50c. For example, implantation, diffusion, or a combination of both, can be used to provide the source, drain, and channel regions for those regions in substrate 50. Furthermore, each of the source, drain, and channel regions may be formed before, during, or after the formation of various layers 52, 54, 56, and 58 of the memory device. In the embodiment shown in FIG. 5, part of source region 50a and drain region 50b may extend to a portion of the substrate area that is directly below gate 58, and channel region 50c may be positioned to correspond to at least a portion of gate 58.

The above examples describe memory devices and methods for forming memory devices. It should be noted that modifications can be made to these examples. For example, electron traps may be provided from oxynitride layer 54 and the design may improve the characteristics of a memory device. In addition, dielectric layer 52 may include a tunnel oxide treated with nitridation, which may provide a good barrier between neighboring layers.

As another example, dielectric layer 52 may be grown from substrate 50 after the formation of the structure above dielectric layer 52. Other sequences of steps may be possible. Therefore, the particular order of the steps set forth in the specification or the figures should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

The foregoing disclosure has been presented for purposes of illustration and description. It is not intended to be exhaustive or to limit the invention to the precise examples disclosed. As noted above, many variations and modifications to the described examples can be made. The scope of the invention is to be defined only by the claims appended hereto and by their equivalents.

What is claimed is:

1. A method for forming a memory device, the method comprising:
   forming a first oxide layer over a semiconductor substrate;
   performing a nitridation of at least an upper portion of the first oxide layer;
   forming a semiconductor layer comprising germanium over the first oxide layer;
   oxidizing the semiconductor layer to provide a germanium oxide layer over the first oxide layer and a second oxide layer over the germanium oxide layer; and
   forming, from the germanium oxide layer, an oxynitride layer containing germanium nanocrystals.

2. The method of claim 1, wherein forming the first oxide layer comprises oxidizing at least a portion of the substrate.

3. The method of claim 1, wherein the nitridation is performed to provide a nitrogen-containing barrier layer over the first oxide layer.

4. The method of claim 1, wherein the nitridation comprises applying nitrogen plasma to the first oxide layer.

5. The method of claim 1, wherein forming the semiconductor layer comprises forming a silicon-germanium layer.

6. The method of claim 1, wherein forming the oxynitride layer comprises:

annealing the germanium oxide layer to form the germanium nanocrystals; and annealing at least an area containing the germanium nanocrystals in an environment containing nitrogen to form the oxynitride layer.

7. The method of claim 1, further comprises forming a gate over the second oxide layer; and forming source, drain, and channel regions in the substrate, the channel region being positioned to correspond to at least a portion of the gate.

8. The method of claim 1, wherein the memory device comprises a non-volatile memory device.

9. A method of forming a memory device, comprising:

forming a first oxide layer over a semiconductor substrate, the first oxide layer having a higher nitrogen element concentration at an upper portion of the first oxide layer than a lower portion of the first oxide layer;

forming a semiconductor layer comprising germanium over the first oxide layer; and forming, from the semiconductor layer, an oxynitride layer containing germanium nanocrystals and a second oxide layer over the first oxide layer.

10. The method of claim 9, wherein forming the first oxide layer comprises oxidizing at least a portion of the substrate.

11. The method of claim 9, wherein forming the first oxide layer comprises performing a nitridation of at least the upper portion of the first oxide layer.

12. The method of claim 11, wherein the nitridation forms a tunnel oxide layer over the substrate and a nitrogen-containing barrier layer over the tunnel oxide layer.

13. The method of claim 11, wherein the nitridation comprises applying nitrogen plasma to the first oxide layer.

14. The method of claim 9, wherein forming the semiconductor layer comprises forming a silicon-germanium layer.

15. The method of claim 9, wherein forming the oxynitride layer and the second oxide layer comprises:

oxidizing the semiconductor layer to provide a germanium oxide layer and a second oxide layer over the germanium oxide layer; and annealing the germanium oxide layer to form the oxynitride layer.

16. The method of claim 15, wherein annealing the germanium oxide layer comprises:

annealing the germanium oxide layer to form the germanium nanocrystals; and annealing a germanium-nanocrystal-containing area in a nitrogen-containing environment to provide the oxynitride layer.

17. The method of claim 9, further comprises forming a gate over the second oxide layer; and forming source, drain, and channel regions in the substrate, the channel region being positioned to correspond to at least a portion of the gate.

18. A method of forming a memory device on a substrate comprising:

forming a first dielectric layer over a semiconductor substrate;

forming an oxynitride layer containing germanium nanocrystals over the first dielectric layer;

forming a second dielectric layer over the oxynitride layer;

forming a gate over the second dielectric layer; and forming source, drain, and channel regions in the substrate, the channel region being positioned to correspond to at least a portion of the gate.

19. The method of claim 18, wherein forming the first dielectric layer comprises oxidizing at least a portion of the substrate.

20. The method of claim 18, further comprises forming a barrier layer between the first dielectric layer and the oxynitride layer.

21. The method of claim 20, wherein forming the barrier layer comprises performing a nitridation of an upper portion of the first dielectric layer.

22. The method of claim 21, wherein the nitridation comprises applying nitrogen plasma to the first dielectric layer.

23. The method of claim 18, wherein forming the oxynitride layer and the second dielectric layer comprises:

forming a semiconductor layer comprising germanium over the first dielectric layer;

oxidizing the semiconductor layer to form a germanium oxide layer and a second oxide layer over the first dielectric layer; and annealing at least an area of the germanium oxide layer to form the oxynitride layer containing the germanium nanocrystals.

24. The method of claim 23, wherein annealing the germanium oxide layer comprises:

annealing the germanium oxide layer to provide the germanium nanocrystals; and annealing a germanium-nanocrystal-containing area in a nitrogen-containing environment to provide the oxynitride layer.

* * * * *